United States Patent [19]
Lin

[11] Patent Number: 5,403,682
[45] Date of Patent: Apr. 4, 1995

[54] ALTERNATING RIM PHASE-SHIFTING MASK

[75] Inventor: Burn J. Lin, Austin, Tex.

[73] Assignee: International Business Machines Corporation, Armonk, N.Y.

[21] Appl. No.: 968,903

[22] Filed: Oct. 30, 1992

[51] Int. Cl.$^6$ .............................................. G03F 9/00
[52] U.S. Cl. ....................................... 430/5; 430/320; 430/321
[58] Field of Search ........................... 430/5, 320, 321

[56] References Cited

U.S. PATENT DOCUMENTS

| | | | |
|---|---|---|---|
| 4,989,823 | 2/1991 | Chapman | 248/638 |
| 5,045,417 | 9/1991 | Okamoto | 430/5 |
| 5,065,214 | 11/1991 | Lapham et al. | 357/43 |
| 5,275,894 | 1/1994 | Tanabe | 430/5 |
| 5,302,477 | 4/1994 | Dao et al. | 430/311 |

FOREIGN PATENT DOCUMENTS 3252659  11/1991  European Pat. Off. ....... G03F 1/08

OTHER PUBLICATIONS

M. D. Levenson, et al., Improving Resolution in Photolithography with a Phase-Shifting Mask, IEEE Transactions of Electron Devices, vol. ED-29, Dec. 1982, pp. 1828–1836.

B. J. Lin, Phase-Shifting and Other Challenges in Optical Mask Technology, SPIE vol. 1496 10th Annual Symposium on Microlithography, 1990, pp. 54–78.

K. Nakagawa, et al., Fabrication of 64M DRAM with i-Line Phase-Shift Lithography, IEDM 90, pp. 817–820 (1990).

A. Nitayama, et al., New Phase Shifting Mask with Self-Aligned Phase Shifters for a Quarter Micron Photolithography, IEDM Technical Digest, pp. 57–60 (1989).

*Primary Examiner*—S. Rosasco
*Attorney, Agent, or Firm*—Graham S. Jones, II; Dale M. Crockatt

[57] ABSTRACT

A phase-shifting mask consisting of phase shifting rim surrounding every pattern. The 0° and 180° areas defined by a straightforward rim phase-shifting mask are reversed alternately for closely packed patterns. This reversal can take the form of 0° to 180° and 180° to 0° as well as the form of 0° to 180° and 0° to −180°. For small opaque lines, the rim phase shifter may become the only picture element, leaving no mask absorber pattern inside the rim. Individual or uniform pattern sizing can be used to ensure a large common exposure-defocus window. Various fabrication techniques requiring or not requiring a second aligned exposure during mask fabrication, combining with several different forms of mask substrate are also described.

45 Claims, 6 Drawing Sheets

ALTERNATING RIM PHASE-SHIFTING MASK

BACKGROUND OF THE INVENTION

1. Field of the Invention

This invention relates to masks for lithography and more particularly to phase-shift masks for use in photolithography.

2. Description of related art.

In photolithography, masks are employed to expose a pattern upon a work piece. As manufacturing requirements call for exposure of patterns with smaller and smaller dimensions, it is becoming necessary to employ techniques which permit enhancement of the current performance of the process of photolithography. One trend has been to use electromagnetic energy with shorter wavelengths in the UV wavelengths, x-rays and the like. An alternative approach is to use phase-shifting techniques in the ranges of wavelengths used in photolithography in the past.

The phase-shifting technique can improve the resolution of coherent or partially coherent optical imaging systems. It has been shown that the normalized resolution k1 can be reduced from 0.7 to 0.35 to improve lithography by two generations.

Use of phase-shifting techniques with masks in optical microlithography systems has been shown to improve projected images. These phase-shifting techniques have been practiced in various configurations as described in the following references.

Nitayama et al, "New Phase Shifting Mask with Self-Aligned Phase Shifters for Quarter Micron Photolithography", IEDM Technical Digest, pp. 57–60 (1989) shows a phase shifting mask (PSM) pattern consisting of a phase-shifting layer and a slightly smaller opaque layer which blocks light at the center of the mask pattern. This mask uses the rim (RIM), i.e. border of the structure, to form a phase shift in the image passing through the mask. In the RIM phase-shifting mask of Nitayama et al, a given mask pattern consists of a substrate carrying a phase-shifting layer and a slightly smaller opaque layer 11 which blocks light at the center of the mask pattern. This arrangement lends itself to strong enhancement of edge contrast due to the phase-shifting, yet prevents a large negative amplitude at the center of patterns to form ghost lines.

The prior art publication by Nitayama et al, above, teaches delineation of the phase-shifting layer on top followed with a self-aligned overetch of the blocking layer. The undercutting dimension and profile are difficult to control for the precision required to maintain linewidth control of the blocking pattern.

Nakagawa et al "Fabrication of 64M DRAM with i-Line Phase-shift Lithography", IEDM 90, pages 817–820 (1990) shows in FIGS. 2(a) and (b) the mask of blocker layer above a phase shift layer, with a chromium blocker having narrower dimensions than the Phase shift layer.

Levenson et al, "Improving Resolution in Photolithography with a Phase-Shifting Mask", IEEE Transactions on Electron Devices, Vol. ED-29, No. 12, pp1828–1836, (Dec. 1982) describes alternating element phase-shifting.

U. S. Pat. No. 5,045,417 of Okamoto for "Mask for Manufacturing Semiconductor Device and Method of Manufacture Thereof" shows (in FIG. 12 thereof) a synthetic quartz glass substrate (2) covered with a metal layer (3) (described as Embodiment 4 in Col. 13, lines 28–62.) A phase-shifting groove (7b) of depth (d) is shown in the quartz glass adjacent to openings in the metal layer (3.)

Provision of phase shift repair layers is described in commonly assigned, copending application Ser. No. 07/886,651, filed Apr. 8, 1992 (FI9-91-119) by Burn Jeng Lin for "A Mask Structure and Process to Repair Missing or Unwanted Phase Shifting Elements." Furthermore, contacting the phase shifters to the substrate 10 reduces multiple reflections at the interfaces.

Descriptions of three methods of fabricating a shifter-based (SB) RIM phase-shifting (PS) mask are described below in commonly assigned, copending U.S. patent application, Ser. No. 07/872,781 (FI9-91-143) of Lin for "A Shifter-Based Rim Phase Shifting Structure and Process to Fabricate the Same."

The alternating-element phase-shifting mask (PSM) by M. D. Levenson, N. S. Viswanathan, and R. A. Simpson, IEEE Trans. Electron Devices, Vol. ED-29, p. 1828, (1982) has the potential to double the resolution of a given optical imaging system. It is the most effective PSM for closely packed structures. Its isofocus characteristics are also very desirable; B. J. Lin, SPIE Proceedings Vol. 1496, p. 54, (1990). However, when there is variable packing in the mask, the alternating-element PSM is less effective. In addition, it does not work on isolated openings or opaque features.

The rim PSM is described in "Fabrication of 64DRAM with i-line phase-shift lithography" by K. Nakagawa, M. Taguchi and T. Ema, IEDM 90, pages 817 to 820 (1990). Rim PSM works on arbitrary mask patterns but its improvement for closely packed patterns is minimal.

In accordance with this invention, an ALRIM PSM consists of rim phase shifters and reversed rim phase shifters. Preferably, absorptive blockers are present and the absorptive blockers are removed for originally narrow isolated absorber lines. The reversed rim phase shifters can be placed alternately with the normal rim phase shifters. The normal rim phase shifters and reverse rim phase shifters can be exchanged. The reversed rim phase shifters can be placed alternately with the normal rim phase shifters. The device can be built on a substrate consisting of an absorber layer on a distinct phase shifter layer on the mask substrate, on a substrate consisting of an absorber layer on the mask substrate, or built on a substrate consisting of an absorber layer on a distinct phase shifter layer on the mask substrate. The device can be built on a substrate consisting of an absorber layer on the mask substrate, or on a substrate consisting of an absorber layer on a distinct phase shifter layer on the mask substrate. Preferably 360° phase shift is used in combination of 0° and 180° built on a substrate consisting of an absorber layer on two distinct phase shifter layers on the mask substrate. Preferably, one of the distinct phase shifter layers 18 is of similar material to that of the mask substrate. The device can be built on a substrate consisting of an absorber etch mask layer on an absorber layer on the mask substrate, or built on a substrate consisting of an absorber etch mask layer on an absorber layer on the mask substrate.

The ALRIM PSM can have the patterns adjusted by a constant size change. The size change can be adjusted individually and the size change can be intra-feature.

In another aspect of the invention, an ALRIM PSM fabrication process comprises a. a two-level resist exposure, b. selective removal of absorber masked by resist after first development, c. selective removal of phase shifter masked by absorber, d. further selective removal of absorber masked by resist after second development Alternatively, an ALRIM PSM fabrication process comprises:

a. formation of a T-shaped etch mask structure b. delineation of all normal rim phase shifter by the T-shaped structure, and c. delineation of reversed rim phase shifters by second and third aligned resist images.

In another alternative, an ALRIM PSM fabrication process comprises:

a. a standard process to fabricate all features into normal rim phase shifter.

b. a second aligned exposure on a new resist layer to define the reversed rim areas for etching.

The ALRIM PSM fabrication process can also comprise:

a. a two-level exposure process, b. selective etching of an absorber etch mask layer masked by the first developed resist image c. second resist development, d. selective etching of the absorber masked by the absorber etch mask e. selective etching of the absorber etch mask masked by the second resist image.

f. second selective etching of the absorber masked by the absorber etch mask.

An ALRIM PSM fabrication process in accordance with this invention comprises formation of:

a. T-shaped etch mask structure b. selective etching of an absorber etch mask layer masked by the top of the T-structure c. Removal of the top of the T-structure d. selective etching of the absorber masked by the absorber etch mask, e. Selective etching of the absorber etch mask masked by bottom of the T Structure f. Second selective etching of the absorber masked by the absorber etch mask A wafer image formation process using an ALRIM PSM mask consists of rim phase shifters and reversed rim phase shifters. Preferably the mask includes absorptive blockers and the absorptive blockers are removed for originally narrow isolated absorber lines. Preferably, the reversed rim phase shifters are placed alternately with the normal rim phase shifters; the normal rim phase shifters and reverse rim phase shifters are exchanged.

Alternatively, the reversed rim phase shifters are placed alternately with the normal rim phase shifters, and the normal rim phase shifters and reverse rim phase shifters are exchanged.

BRIEF DESCRIPTION OF THE DRAWINGS

FIG. 2A, which is identical to FIG. 1B, uses a distinct phase shifter layer above the quartz substrate.

FIG. 2B uses a single quartz substrate wherein the thickness difference produces the desired phase shift.

FIG. 2C continues with the single layer carved substrate used in FIG. 2B but 360° steps are created to return the phase shift to zero in the reversed rim areas.

FIG. 2D uses the 360° principle as in FIG. 2C but multiple layer phase shifters are employed in the substrate.

FIG. 2E reversed the 0° and 180° phase shifted areas in FIG. 2B.

The foregoing and other aspects and advantages of this invention are explained and described below with reference to the accompanying drawings, in which:

DESCRIPTION OF THE PREFERRED EMBODIMENT

Figure 1A:
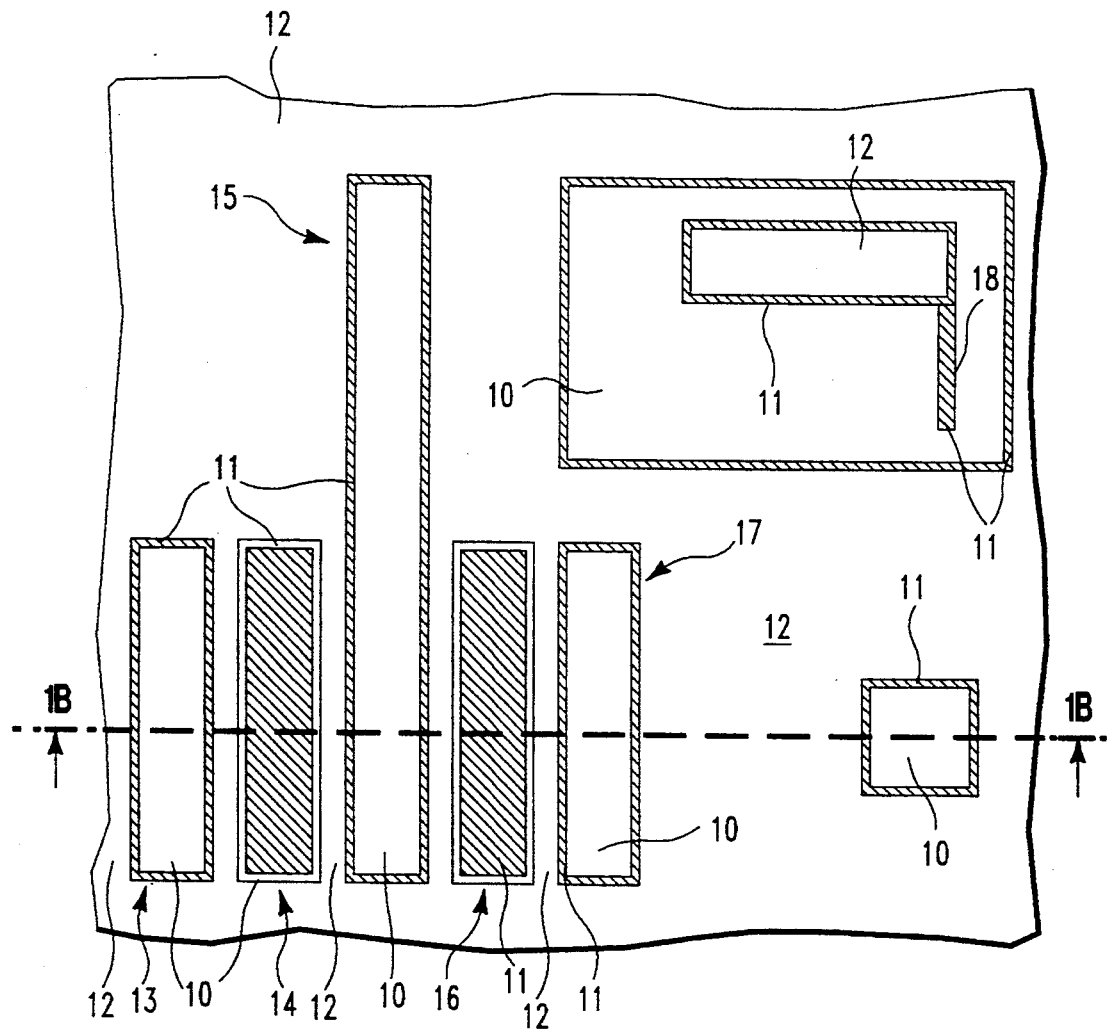
FIG. 1A shows a top view of an alternating element rim phase shifting mask (ALRIM PSM) consisting of dense elements, a protruding element from the dense group, an isolated opening, an isolated large feature and an isolated small feature to demonstrate how the rim and reversed rim are placed to compose the ALRIM PSM.
Figure 1B:
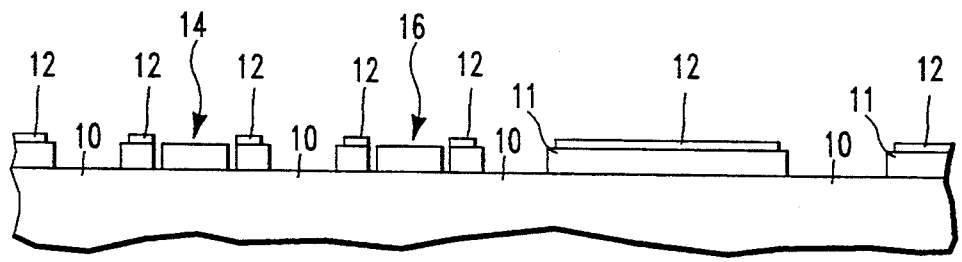
FIG. 1B is the cross section of FIG. 1A taken along line 1B—1B in FIG. 1A.

FIG. 1A shows a top view of an alternating-element rim phase-shifting mask(ALRIM PSM) consisting of dense elements, a protruding element from the dense group, an isolated opening, an isolated large feature and an isolated small feature to demonstrate how the rim and reversed rim are placed to compose the ALRIM PSM. FIG. 1B is the cross-section of FIG. 1A at the line 1B—1B.

The inventor has discovered the advantages when rim and alternating PSM are combined in an alternating RIM (ALRIM) phase-shifting mask (PSM) (referred to hereinafter as (ALRIM) PSM) wherein every pattern in the mask consists of a phase shifting rim and the phase of the shifted and unshifted areas for adjacent patterns are reversed. In the very small opaque features, the absorber may be completely removed leaving the rims which become the entire opaque patterns.

This invention combines the advantage of both PSM systems by reversing the phase of the rim and its main pattern in every other opening. An example is shown in FIGS. 1A and 1B. A quartz substrate 10 has been coated with a phase shifter material 11 which has been patterned. In some places on top of the phase shifter material 11, is a layer of chrome 12. All openings down to the quartz 10 are surrounded by a rim (border) of phase shifter material 11 extending beyond the chrome layer 12, as shown by FIGS. 1A and 1B, but the rims reverse phase at every other opening, as do the main patterns as depicted by the cross section in FIG. 1B. The phases need not be reversed only when the neighboring openings are sufficiently far apart so that the diffraction patterns from them do not interfere with each other. In FIGS. 1A and 1B, all except two openings have the regular 180° phase shifted rims around them. In the second and fourth bars 14 and 16, the rims are now at 0° while the inside of the openings are shifted 180° which is just opposite to the normal rim shifts everywhere else. These rims are called reversed rims. Element 18 shows the situation of a small isolated dark image to be made. This element consists of a pure narrow phase shifter and nothing else. The absorbing blocker inside the-phase shifter such as element 12 surrounded by rim 11 is not needed for element 18.

Figure 2A:
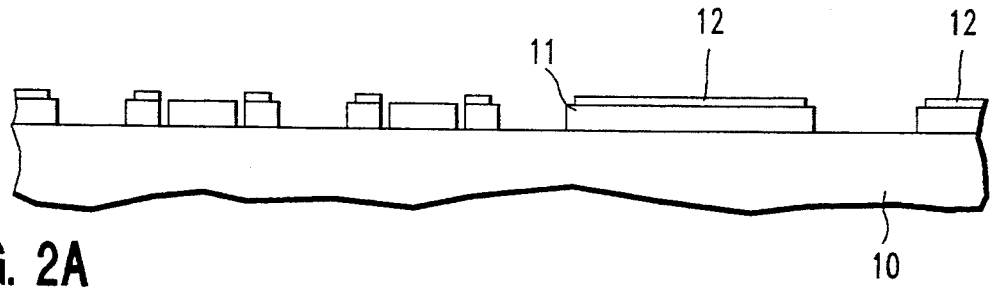
FIGS. 2A–2E show an assortment of ALRIM PSM cross-sections as a function of the substrate and fabrication process chosen.

FIGS. 2A-2E show possible cross-sections of the alternating rim PSM. FIG. 2A regular phase shifted rims around them In the second and fourth bars 14 and 16, the rims are now at 0° while the inside of the openings are shifted 180° which is Just opposite to the normal rim shifts everywhere else. These rims are called reversed rims.

FIGS. 2A-2E show an assortment of possible ALRIM PSM cross-sections as a function of the substrate and fabrication process chosen.

FIG. 2A which is identical to FIG. 1B uses a distinct phase shifter layer 11 above the quartz substrate 10. If deemed necessary in fabrication, an additional thin etch stop layer can be placed between 11 and 12.

Figure 2B:
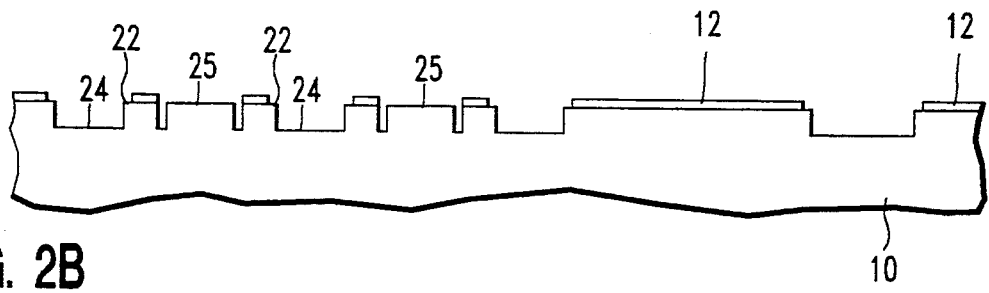

FIG. 2B shows an identical cross-section to that of FIG. 2A, except that no extra phase shifter layer is required. Phase shifting is produced by the differences in thickness from place to place in the quartz layer, shown herein as a single quartz substrate. Here, if the relative phase shift at location 24 is taken to be zero, then the phase shift at locations 22 and 25 is 180°. When the PSM is made without an additional PS (phase shift) layer, a possible cross-sections is shown in FIG. 2B where the quartz has been etched to produce the rims 22 of phase shifting structures beneath the chrome layer 12, adjacent to the valleys 24 in the quartz substrate 10.

Figure 2C:
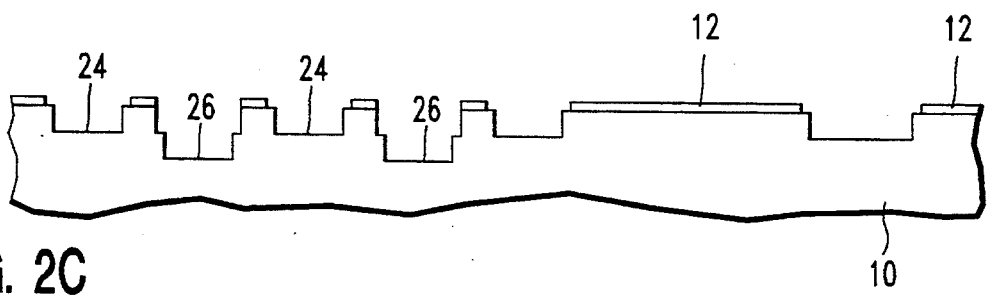

FIG. 2C continues with the single layer carved substrate used in FIG. 2B but 360° steps are created to return the phase shift to zero in the reversed rim areas. Phase shifting can be achieved by −180° in addition to +180°, as shown in FIG. 2C where the quartz valleys 26 replace the mesas 25.

Figure 2D:
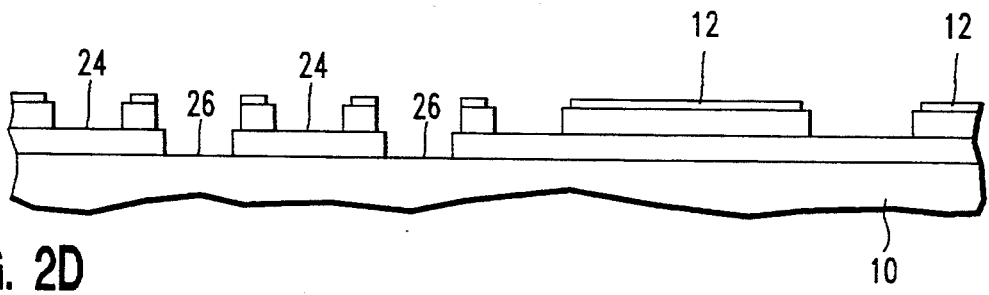
Figure 2E:
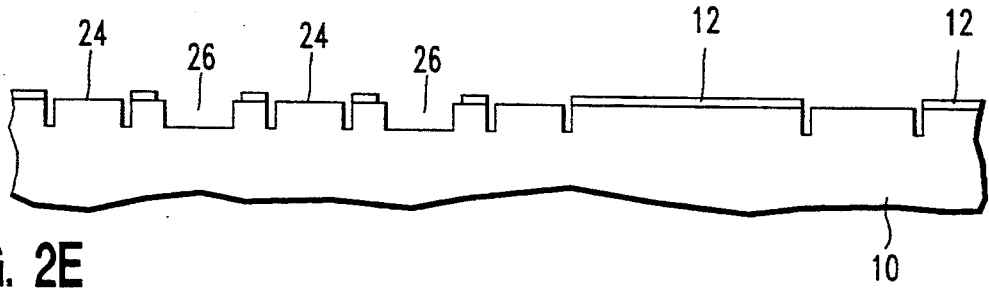

FIG. 2D uses the 360° principle as in FIG. 2C, but multiple layer phase shifters are employed in the substrate. A two-layer counterpart of FIG. 2C is shown in FIG.2D. Instead of creating phase shifts by the difference in step heights in a single piece of quartz, two distinct phase shifting layers above the quartz substrate are used. Selective removal of each phase shifter layer creates local 0°,180° and 360° phase shifts FIG. 2E reversed the 0° and 180° shifted areas in FIG. 2B. Rim reversal can start on the other set of openings as shown in FIG.2E. Many other variations following the spirit of this invention are possible.

In order to produce a large common exposure-defocus (ED) window for all features on the mask, they can be biassed to different sizes by a fixed differential size change on the mask to delineate the desired image dimension on the wafer. For example, it is usually beneficial to make the opening 0.1–0.2 λ/NA larger than the image opening, (where A is the wavelength.) The rim width is of the order of also 0.1–0.2 λ/NA outside of the already biassed openings.

To further enlarge The E-D window, the bias can be varied according to the proximity environment of the mask, i.e. the feature size, shape, and its vicinity to other features, resulting in different biases on same mask. It is also advantageous to remove the mask absorber altogether for small opaque features, such as element 18 in FIG. 1A. These features now consist of only phase shifters or non-phase-shifters 180° with respect to their background.

A possible fabrication process uses the gray-level exposure technique taught in U.S. patent application Ser. No. 07/872,781 (FI9-91-143) of Lin for "A Shifter-Based Rim Phase Shifting Structure and Process to Fabricate the Same", as shown in FIGS. 3A-3C.

Figure 3A:
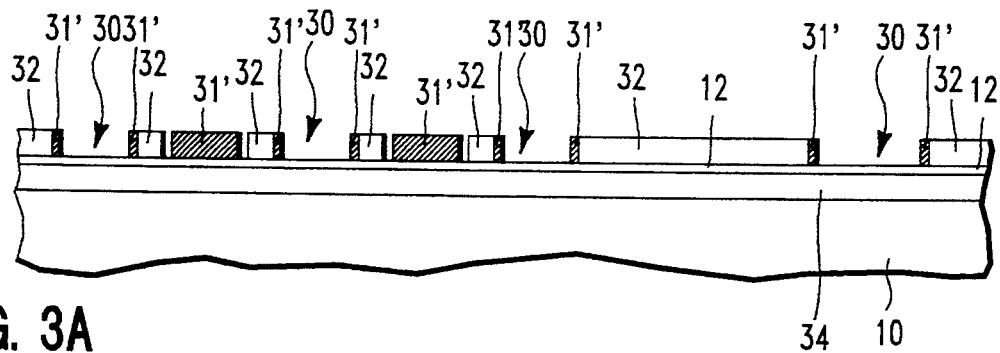
FIGS. 3A–3C show a possible fabrication process in accordance with this invention using a gray-level exposure technique.

Referring to FIG. 3A, photoresist has been exposed to three different levels and has been developed. The fully exposed portion of the resist provides an image in the form of openings 30 which are developed in the first development of the resist. Such development opens up the surface of portions of the chromium absorber 12 and the phase shifter layer 34 for etching (as shown in FIGS. 3A and 3B, respectively.) The reversed rims 30' centering at the two large partially exposed area 31' are delineated simultaneously in this etch. Unexposed resist 32 is shown on either side of image openings 30. The absorber 12 is etched away where the resist image provides openings 30.

Figure 3B:
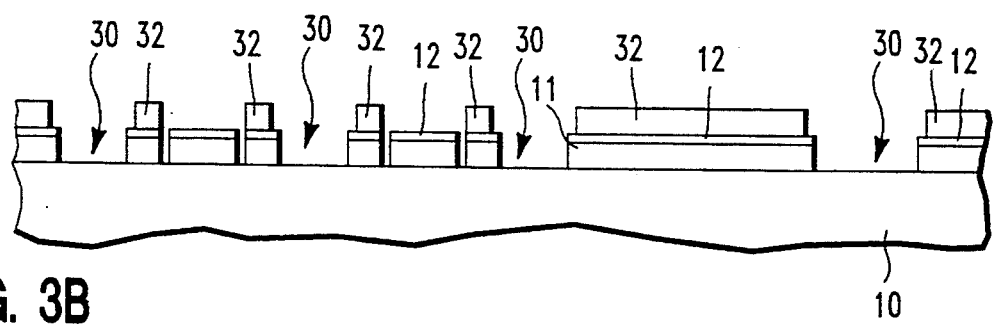

FIG. 3B shows the product of FIG. 3A after a chromium Cr, phase shifter PS etch and a second resist development step. In FIG. 3B the second resist development of the partially exposed resist at 31 and 31' after Cr/PS etch, reveals the absorber in the regular rim areas 31 and in the reversed main openings 31' for etching. (That is, the partially exposed resist 31' has been removed exposing the chromium absorber 12 beneath it.) The full and partial exposures can be performed in single or multiple passes, but no alignment is required.

Figure 3C:
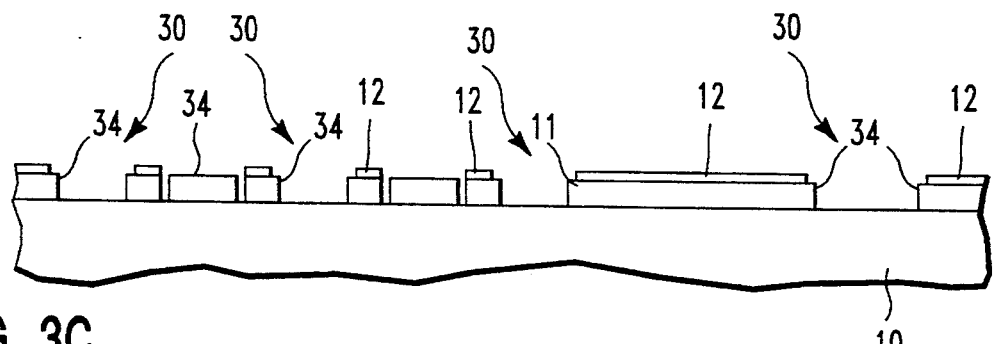

FIG. 3C shows the product of FIG. 3B after a first step comprising a second Cr etch of absorber 12 using the unexposed resist 32 as a mask followed by removal of the unexposed resist 32. It is evident that the only absorber 12 remaining is that which was covered by the unexposed resist 32. The various structures have rims on either side of openings 30.

Another process to fabricate a mask comprising an Alternating RIM PAM (ALRIM PSM) is shown in FIGS. 4A-4D. One of the self-aligned rim delineation processes described in U.S. patent application Ser. No. 07/872,781, is used to pattern all openings with regular rims at openings 35. The openings 36 with the reversed rim areas not yet delineated. An aligned second exposure delineates the reversed rim. A third exposure with less demanding alignment accuracy facilitates removal of unwanted absorbers in the main openings of the reversed areas.

Figure 4A:
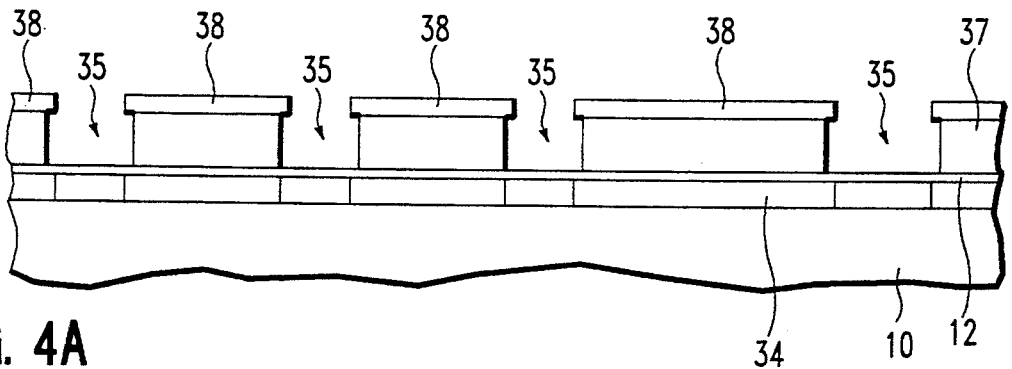
FIGS. 4A–4D show another process for fabricating a mask comprising an Alternating RIM PAM (ALRIM PSM), comprising a the self-aligned rim delineation process used to pattern all openings with regular rims at mask openings.

FIG. 4A shows the self-aligned rim structure 38 that can be a two layer resist image. Similar parts from FIG. 3A are numbered similarly and are composed of similar materials. FIG. 4A is MLR developed and ready for self-aligned etching as shown in FIG. 3B.

Figure 4B:
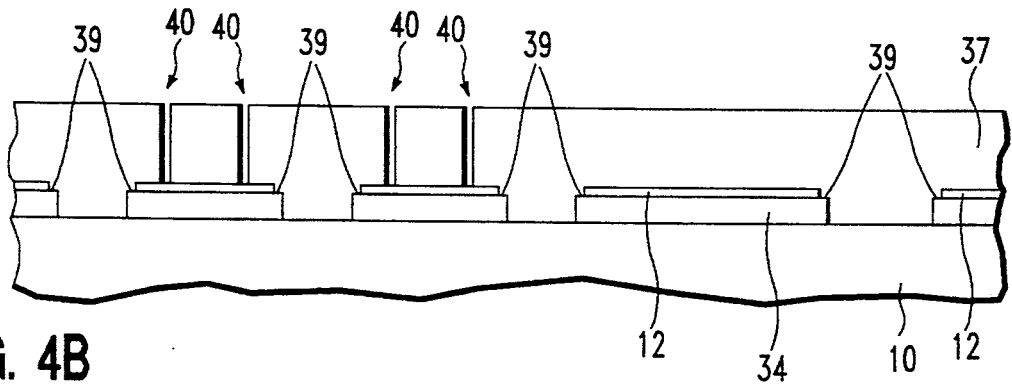

The finished regular rims 39 in FIG. 4B are fabricated by using the top of the T-structures 38 to mask the etching of the phase shifter layer 34, removing the top of the T, then use the bottom of the T to mask the etching of the absorber layer 12. Later a second resist layer 37 is coated on the mask. The exposed and developed resist image is shown in FIG. 4B with openings 40 in the second resist layer 37.

Figure 4C:
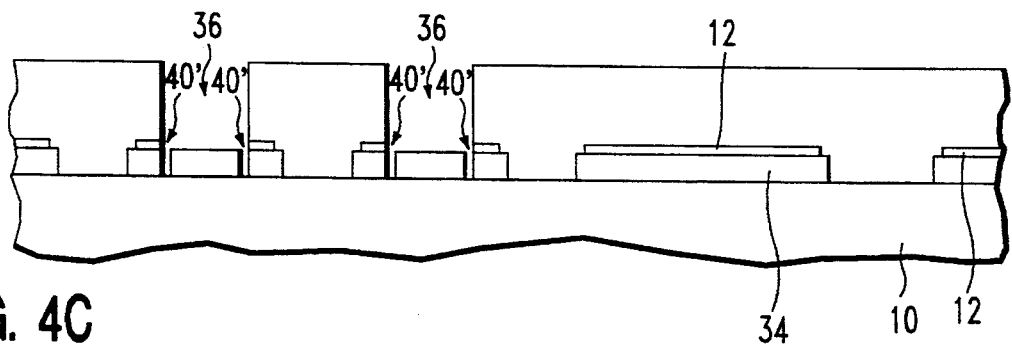

FIG. 4C shows the selective removal of absorber 12, followed by the selective removal of the second layer of resist 37 at locations 36 then, selective removal of phase shifter 34 masked by the absorber openings 40'.

Figure 4D:
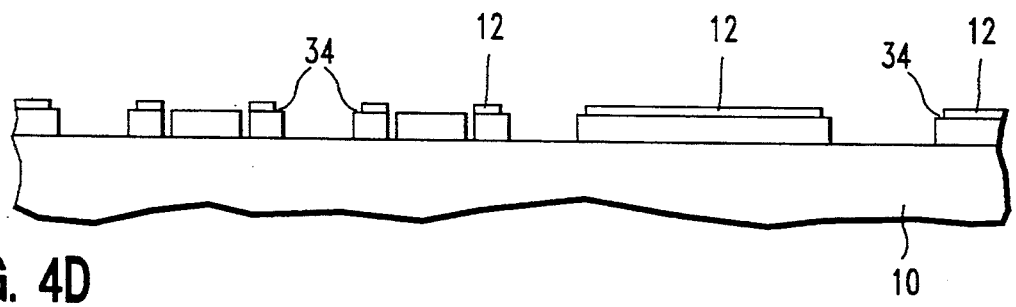

FIG. 4D shows the finished ALRIM PSM after the absorber 12 in openings 36 is removed (etched away) with the mask 37 protecting the remainder of the absorber 12 which had been exposed in FIG. 4B before the second resist layer 37 was added.

Figure 5A:
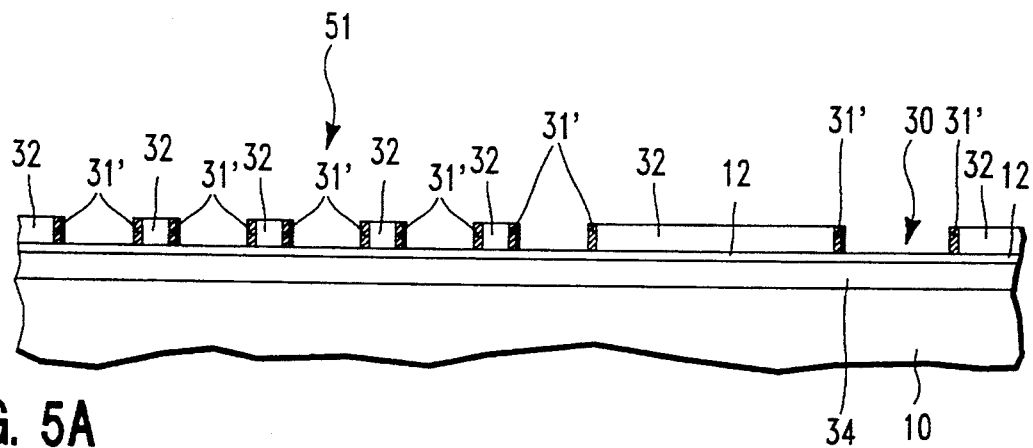
FIGS. 5A–5C show a variation of the two (gray) level exposure process shown in FIG. 3A–3C except that only the resist in the rim areas has received partial exposure.
Figure 5B:
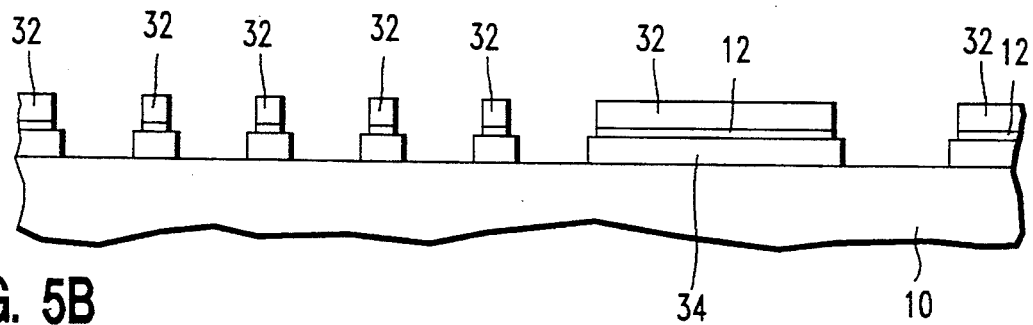
Figure 5C:
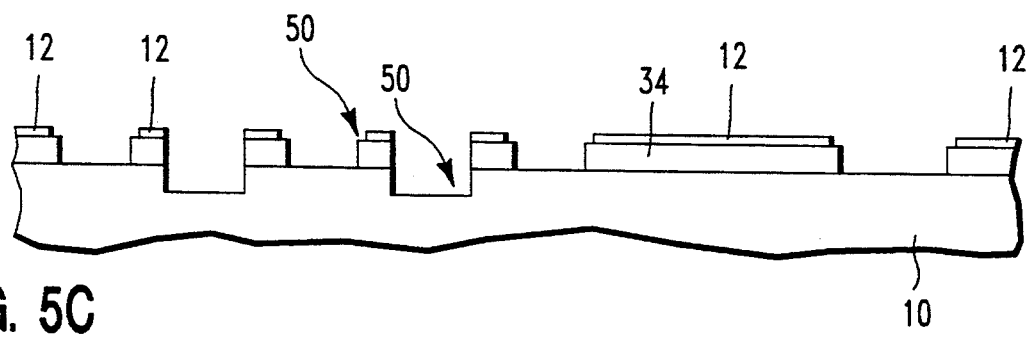

Yet another fabrication process is shown in FIGS. 5A–5C. All openings are delineated by any of the known rim fabrication techniques. The reversed areas are subsequently created with an aligned second exposure, opening the reversed area so that the rim and the main opening can be etched down by the thickness for a 180° phase change.

The thin inorganic etch mask for the absorber used in U.S. patent application Ser. No. 07/872,781, is also applicable for ALRIM. Its usage is mainly to reduce the task of delineating the absorber and a relatively much thicker phase shifter to the task of only delineating two thin layers while the resist image has to be kept intact.

The two (gray) level exposure process described in FIG. 3A–3C is now used to teach the concept is shown in FIG. 5A, except that only the resist 31' in the rim areas has received partial exposure. The exposed resist has left openings 51 where some partially exposed resist had remained in FIG. 3A.

FIG. 5B, shows the resultant regular rim structure throughout.

FIG. 5C shows the result of opening up the reversed rim areas by a second resist coating (not shown) and aligned exposure followed with resist development and phase shifter etching masked by the second resist image.

Figure 6A:
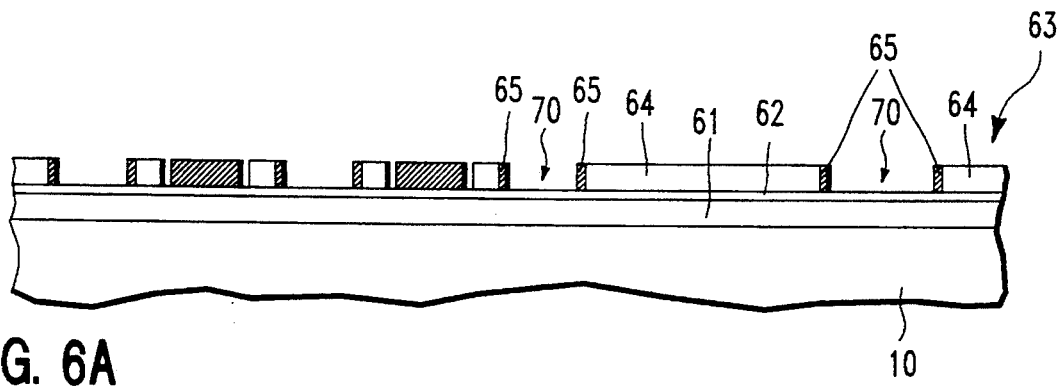
FIGS. 6A–6D show a gray-level exposure technique combined with an absorber etch mask layer to fabricate the structure shown in FIG. 2B.

FIG. 6A shows the resist image after the first resist development, removing all the completely exposed resist while leaving the partially exposed and unexposed resist on the mask. A substrate 10 is coated with an absorber layer 61 composed of chromium, coated in turn with an absorber etch mask layer 62 composed of aluminum, coated in turn with a layer 63 of resist some of which is unexposed resist 64 (which is not shown hatched in the drawing) and part of which is partially exposed resist 65 (which is shown hatched in the drawing.) The fully exposed resist has been removed by development to leave openings 70 which reach down to the absorber etch mask layer 62.

Figure 6B:
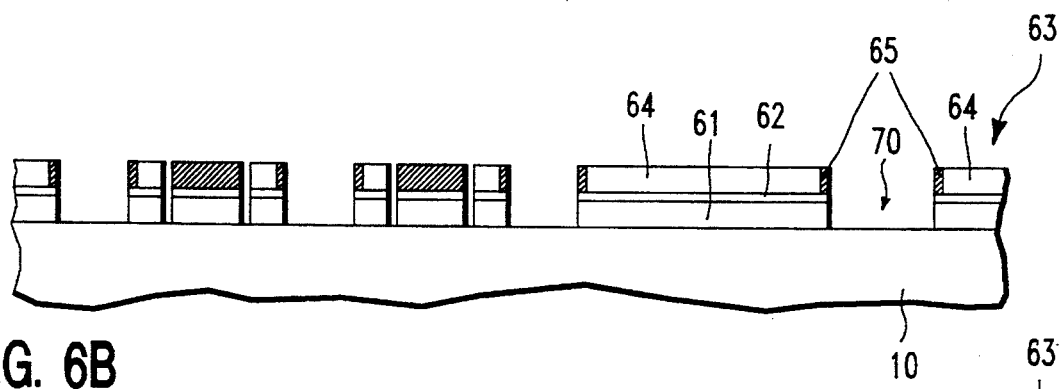

In FIG. 6B, the resist layer is used as an etch mask for the absorber etch mask layer which is in turn used to mask the absorber etch without alternating the resist development property. The resist layer 63 is used as a mask when absorber etch mask layer 62 and absorber layer 61 are both etched to make the openings 70 extend deeper to the the substrate 10 composed of quartz which is not etched by the etchant for the absorber layers 62 and 61.

Figure 6C:
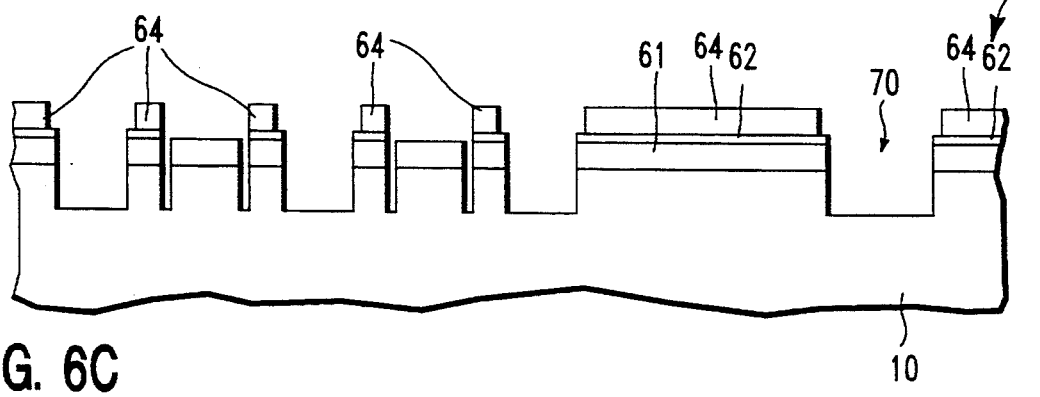

FIG. 6C shows the resist image after the second development followed by the second etching of-the absorber etch mask layer and the etching of the phase shifter layer. The etch mask for the absorber etch mask layer is the unexposed resist image and that for the phase shifter layer is the absorber image.

Figure 6D:
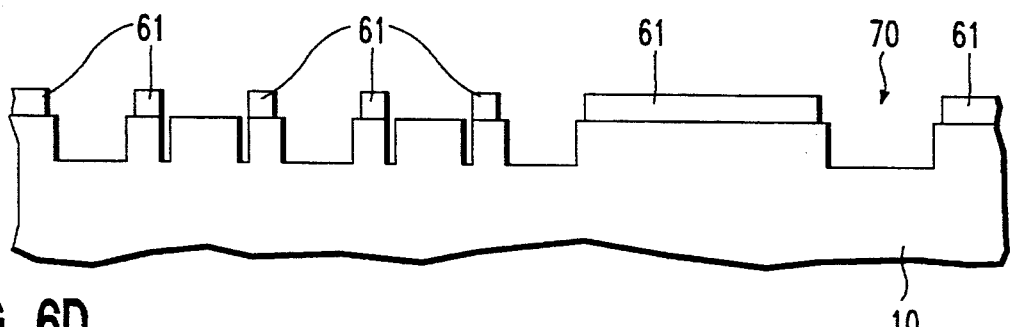

In FIG. 6D, the absorber at the rims is removed using the making of the absorber etch mask image. Then the resist and the absorber etch mask are removed, completing the ALRIM fabrication process.

While this invention has been described in terms of the above embodiment(s), those skilled in the art will recognize that the invention can be practiced with modifications within the spirit and scope of the appended claims.

Having thus described the invention, what is claimed as new and desirable and desired to be secured by Letters Patent is as follows:

1. An ALRIM PSM consisting of rim phase shifters and reversed rim phase shifters.

2. An ALRIM PSM in accordance with claim 1 where absorptive blockers are present and said absorptive blockers are removed for originally narrow isolated absorber lines.

3. An ALRIM PSM in accordance with claim 2 where the reversed rim phase shifters are placed alternately with the normal rim phase shifters.

4. An ALRIM PSM in accordance with claim 3 where the normal rim phase shifters and reverse rim phase shifters are exchanged.

5. An ALRIM PSM in accordance with claim 4 built on a substrate consisting of an absorber layer on a distinct phase shifter layer on the mask substrate.

6. An ALRIM PSM in accordance with claim 5 built on a substrate consisting of an absorber layer on two distinct phase shifter layers on the mask substrate.

7. An ALRIM PSM in accordance with claim 4 built on a substrate consisting of an absorber layer on the mask substrate.

8. One of said distinct phase shifter layers in claim 7 is of similar material to that of the mask substrate.

9. An ALRIM PSM in accordance with claim 4 where 360° phase shift is used in combination of 0° and 180°.

10. An ALRIM PSM in accordance with claim 4 built on a substrate consisting of an absorber etch mask layer on an absorber layer on the mask substrate.

11. The ALRIM PSM in claim 4 where the patterns are adjusted by a constant size change.

12. The ALRIM PSM in accordance with claim 4 where the size change is adjusted individually.

13. The mask of claim 12 wherein the size change include intra-feature change.

14. An ALRIM PSM in accordance with claim 3 built on a substrate consisting of an absorber layer on a distinct phase shifter layer on the mask substrate.

15. An ALRIM PSM in accordance with claim 3 built on a substrate consisting of an absorber layer on the mask substrate.

16. An ALRIM PSM in accordance with claim 3 built on a substrate consisting of an absorber etch mask layer on an absorber layer on the mask substrate.

17. The ALRIM PSM in claim 3 where the patterns are adjusted by a constant size change.

18. The ALRIM PSM in accordance with claim 3 where the size change is adjusted individually.

19. The mask of claim 18 wherein the size change include intra-feature change.

20. An ALRIM PSM in accordance with claim 2 built on a substrate consisting of an absorber layer on a distinct phase shifter layer on the mask substrate.

21. An ALRIM PSM in accordance with claim 2 built on a substrate consisting of an absorber layer on the mask substrate.

22. An ALRIM PSM in accordance with claim 2 built on a substrate consisting of an absorber etch mask layer on an absorber layer on the mask substrate.

23. The ALRIM PSM in claim 2 where the patterns are adjusted by a constant size change.

24. The ALRIM PSM in accordance with claim 2 where the size change is adjusted individually.

25. The mask of claim 24 where in the size change include intra-feature change.

26. An ALRIM PSM in accordance with claim 1 where the reversed rim phase shifters are placed alternately with the normal rim phase shifters.

27. An ALRIM PSM in accordance with claim 26 where the normal rim phase shifters and reverse rim phase shifters are exchanged.

28. An ALRIM PSM in accordance with claim 27 built on a substrate consisting of an absorber layer on a distinct phase shifter layer on the mask substrate.

29. An ALRIM PSM in accordance with claim 27 built on a substrate consisting of an absorber layer on the mask substrate.

30. An ALRIM PSM in accordance with claim 27 built on a substrate consisting of an absorber etch mask layer on an absorber layer on the mask substrate.

31. The ALRIM PSM in claim 27 where the patterns are adjusted by a constant size change.

32. The ALRIM PSM in accordance with claim 27 where the size change is adjusted individually.

33. The mask of claim 32 wherein the size change include intra-feature change.

34. An ALRIM PSM in accordance with claims 26 built on a substrate consisting of an absorber layer on a distinct phase shifter layer on the mask substrate.

35. An ALRIM PSM in accordance with claim 26 built on a substrate consisting of an absorber layer on the mask substrate.

36. An ALRIM PSM in accordance with claim 26 built on a substrate consisting of an absorber etch mask layer on an absorber layer on the mask substrate.

37. The ALRIM PSM in claim 26 where the patterns are adjusted by a constant size change.

38. The ALRIM PSM in accordance with claim 26 where the size change is adjusted individually.

39. The mask of claim 38 wherein the size change include intra-feature change.

40. An ALRIM PSM in accordance with claim 1 built on a substrate consisting of an absorber layer on a distinct phase shifter layer on the mask substrate.

41. An ALRIM PSM in accordance with claim 1 built on a substrate consisting of an absorber layer on the mask substrate.

42. An ALRIM PSM in accordance with claim 1 built on a substrate consisting of an absorber etch mask layer on n absorber layer on the mask substrate.

43. The ALRIM PSM in claim 1 where the patterns are adjusted by a constant size change.

44. The ALRIM PSM in accordance with claim 1 where the size change is adjusted individually.

45. The mask of claim 44 wherein the size change include intra-feature change.

* * * * *